(12) United States Patent
Wang (10) Patent No.: US 11,569,315 B2
(45) Date of Patent: Jan. 31, 2023

(54) DISPLAY PANEL AND MANUFACTURING METHOD THEREOF (71) Applicant: BOE TECHNOLOGY GROUP CO., LTD., Beijing (CN)

(72) Inventor: Tao Wang, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 140 days.

(21) Appl. No.: 17/058,352

(22) PCT Filed: Mar. 27, 2020

(86) PCT No.: PCT/CN2020/081778
§ 371 (c)(1),
(2) Date: Nov. 24, 2020

(87) PCT Pub. No.: WO2020/238379
PCT Pub. Date: Dec. 3, 2020

(65) Prior Publication Data
US 2021/0118965 A1 Apr. 22, 2021

(30) Foreign Application Priority Data
May 31, 2019 (CN) .......................... 201910475324.3

(51) Int. Cl.
H01L 27/32 (2006.01)
H01L 51/52 (2006.01)
H01L 51/56 (2006.01)

(52) U.S. Cl.
CPC ...... H01L 27/3246 (2013.01); H01L 51/5246 (2013.01); H01L 51/5253 (2013.01); H01L 51/56 (2013.01); H01L 2227/323 (2013.01)

(58) Field of Classification Search
None
See application file for complete search history.

(56) References Cited

U.S. PATENT DOCUMENTS

| 10,276,823 B2 | 4/2019 | Jin et al. |
| 10,944,070 B2 | 3/2021 | Kim et al. |
| 2009/0212689 A1 | 8/2009 | Lee et al. |

(Continued)

FOREIGN PATENT DOCUMENTS

| CN | 106601781 A | 4/2017 |
| CN | 106783926 A | 5/2017 |

(Continued)

OTHER PUBLICATIONS

First Chinese Office Action dated Jan. 7, 2021, received for corresponding Chinese Application No. 201910475324.3, 9 pages.

*Primary Examiner* — Michelle Mandala
(74) *Attorney, Agent, or Firm* — Kinney & Lange, P.A.

(57) ABSTRACT

The embodiment of the present disclosure provides a display panel and a manufacturing method thereof. The display panel includes: an active area; and an aperture area at least partially surrounded by the active area, wherein at least one barrier wall is provided between the active area and the aperture area, a thin film encapsulation is provided on a first side of the display panel, and the thin film encapsulation covers the barrier wall and the active area, and wherein a convex-concave structure is provided on at least one surface of the barrier wall in contact with the thin film encapsulation.

18 Claims, 7 Drawing Sheets (56) References Cited

U.S. PATENT DOCUMENTS

2011/0291268 A1    12/2011   Wang et al.
2021/0118965 A1     4/2021   Wang
2021/0359252 A1*   11/2021   Wang ..................... H01L 51/56

FOREIGN PATENT DOCUMENTS

| CN | 107452894 A | 12/2017 |
| CN | 207676946 U | 7/2018 |
| CN | 108376692 A | 8/2018 |
| CN | 109494242 A | 3/2019 |
| CN | 109585676 A | 4/2019 |
| CN | 109742133 A | 5/2019 |
| CN | 110148683 A | 8/2019 |
| JP | 2007250298 A | 9/2007 |
| JP | 2011060442 A | 3/2011 |

* cited by examiner

Fig. 10

DISPLAY PANEL AND MANUFACTURING METHOD THEREOF

CROSS-REFERENCE TO RELATED APPLICATION

This application is a Section 371 National Stage Application of International Application No. PCT/CN2020/081778, filed Mar. 27, 2020, which claims the benefit of Chinese Patent Application No. 201910475324.3 filed on May 31, 2019, the whole disclosure of which is incorporated herein by reference.

TECHNICAL FIELD

The present disclosure relates to the field of display technology, in particular to a display panel and a manufacturing method thereof.

BACKGROUND

With the development of technology, special-shaped screens and full screens have gradually come into everyone's field of vision in recent years. Both special-shaped screens and full screens are aimed at increasing a screen-to-body ratio of the display device. Then, in order to obtain a higher screen-to-body ratio, some additional components (such as cameras and sensors) are disposed in a display screen, so some aperture areas (such as apertures) need to be reserved for the components in some locations of the display.

For products with apertures disposed in the display screen, in encapsulation process of display panels (especially organic light emitting diode (OLED) display panels), there may be a solution leveling area in an organic encapsulation layer in a thin film encapsulation. Thickness of the film will increase first and then decrease in the solution leveling area, which may cause uneven thickness near the aperture area.

SUMMARY

According to an embodiment of the present disclosure, there is provided a display panel, comprising: an active area; and an aperture area at least partially surrounded by the active area, wherein at least one barrier wall is provided between the active area and the aperture area, a thin film encapsulation is provided on a first side of the display panel, and the thin film encapsulation covers the barrier wall and the active area, and wherein a convex-concave structure is provided on at least one surface of the barrier wall in contact with the thin film encapsulation.

In some embodiments, the display panel further comprises a substrate located on a second side of the display panel opposite to the first side, and the barrier wall has a first surface facing away from the substrate, a second surface facing the substrate, a third surface located between the first surface and the second surface and facing away from the aperture area, and a fourth surface located between the first surface and the second surface and facing the aperture area, and the convex-concave structure comprises a bump or a recess disposed on at least one of the first surface, the second surface, the third surface, or the fourth surface of the barrier wall.

In some embodiments, the barrier wall is cylindrical, and the convex-concave structure comprises a plurality of bumps, and the plurality of bumps are disposed on at least one of an outer or an inner peripheral surface of the barrier wall at intervals along a circumferential direction of the barrier wall.

In some embodiments, an interval between adjacent two bumps of the plurality of bumps is between about 3 $\mu$m and about 50 $\mu$m.

In some embodiments, a maximum width of roots of the plurality of bumps is greater than that of tops of the plurality of bumps.

In some embodiments, the barrier wall has a straight segment and a corner segment in a cross section parallel to the substrate, and an interval between two adjacent bumps in the straight segment is smaller than that between two adjacent bumps in the corner segment.

In some embodiments, the convex-concave structure comprises one or more recesses disposed on the first surface of the barrier wall.

In some embodiments, the at least one barrier wall comprises:
a first barrier wall arranged around the aperture area; and
a second barrier wall located on a side of the first barrier wall facing away from the aperture area and arranged around the first barrier wall.

In some embodiments, the barrier wall comprises a plurality of segments arranged at intervals along a circumferential direction of the aperture area.

In some embodiments, each barrier wall comprises at least one insulating layer on the substrate, and a bump or a recess is provided on a surface of the at least one insulating layer in contact with the thin film encapsulation.

In some embodiments, the active area comprises an interlayer dielectric layer, a planarization layer, and a pixel definition layer, and the at least one insulating layer comprises:
a first insulating layer, the first insulating layer and the planarization layer being disposed in the same layer and made of the same material; and
a second insulating layer, the second insulating layer and the pixel definition layer being disposed in the same layer and made of the same material.

In some embodiments, the active area further comprises a post spacer layer, and the at least one insulating layer further comprises:
a third insulating layer, the third insulating layer and the post spacer layer being disposed in the same layer and made of the same material.

In some embodiments, the thin film encapsulation comprises an organic encapsulation layer and one or more inorganic encapsulation layers, and the one or more inorganic encapsulation layers cover the barrier wall and encapsulate the organic encapsulation layer.

In some embodiments, the display panel is an organic light emitting diode display panel.

In some embodiments, the aperture area is completely surrounded by the barrier wall.

In some embodiments, one or more recesses are disposed on a first surface of the first barrier wall facing away from the substrate, and one or more recesses are disposed on a first surface of the second barrier wall facing away from the substrate.

In some embodiments, a depth of the recess on the first surface of the second barrier wall is greater than that of the recess on the first surface of the first barrier wall.

In some embodiments, the third insulating layer is located on the second insulating layer, and a width of a cross section of the third insulating layer parallel to the substrate is smaller than that of a cross section of the second insulating layer parallel to the substrate, to form the convex-concave structure.

In some embodiments, the display panel further comprises an additional barrier wall disposed on an outer periphery of the active area, and a convex-concave structure is provided on at least one surface of the additional barrier wall in contact with the thin film encapsulation.

According to an embodiment of the present disclosure, there is also provided a manufacturing method of a display panel, comprising: fabricating a barrier wall on a substrate, the barrier wall being arranged at least partially around an aperture area of the display panel; and forming a thin film encapsulation covering the barrier wall and an active area of the display panel on the substrate, wherein, a convex-concave structure is provided on at least one surface of the barrier wall in contact with the thin film encapsulation.

BRIEF DESCRIPTION OF THE DRAWINGS

In order to explain technical solutions of the embodiments of the present disclosure more clearly, drawings of the embodiments will be briefly described below. It should be understood that the drawings described below only refer to some embodiments of the present disclosure, not to restrictions of the present disclosure, in which.

DETAILED DESCRIPTION OF EMBODIMENTS

In order to illustrate objectives, technical solutions, and advantages of the present disclosure more clearly, the embodiments of the present disclosure will be described in detail below with reference to accompanying drawings. It should be understood that the following descriptions of the embodiments are intended to explain and illustrate a general idea of the present disclosure, and should not be understood as a limitation to the present disclosure. In the specification and drawings, the same or similar reference numbers refer to the same or similar parts or components. For clarity, the accompanying drawings are not necessarily drawn to scale, and some well-known parts and structures may be omitted from the accompanying drawings.

Unless otherwise defined, the technical terms or scientific terms used in the present disclosure shall have usual meanings understood by those with ordinary skills in the field to which the present disclosure belongs. The words "first", "second" and similar words used in the present disclosure do not indicate any order, quantity, or importance, but are only used to distinguish different components. The word "a" or "an" does not exclude multiple ones. The words "include" or "contain" and other similar words mean that the elements or objects appearing in front of the word cover the elements or objects listed after the word and their equivalents, without excluding other elements or objects. The words "connected" or "coupled" and other similar words do not limit to physical or mechanical connections, but may include electrical connections, whether directly or indirectly. The words "up", "down", "left", "right", "top" or "bottom" and the like are only used to indicate a relative position relationship. When an absolute position of a described object changes, the relative position relationship may also changes accordingly. When an element such as a layer, a film, an area, or a substrate is referred to as being "on" or "under" another element, the element can be "directly" "on" or "under" the other element, or there may be an intermediate element.

Figure 1:
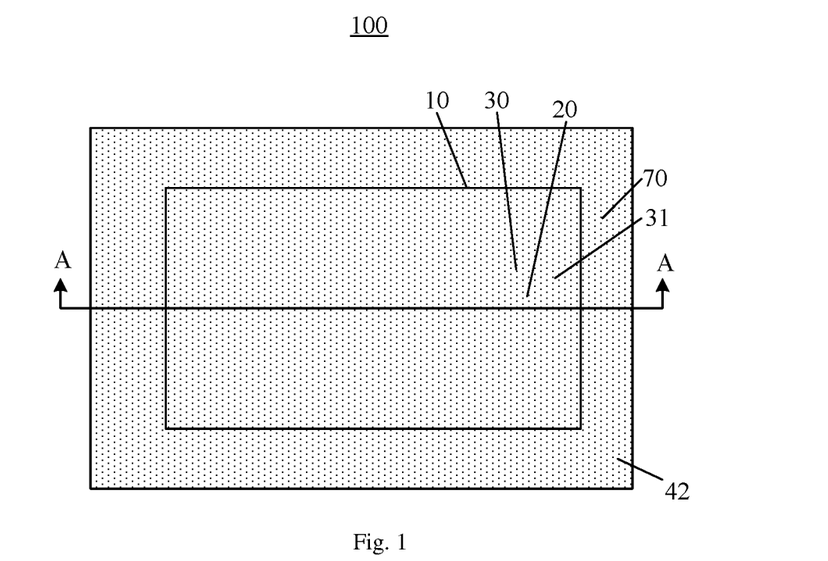
FIG. 1 shows a schematic top view of a structure of a display panel according to an embodiment of the present disclosure.
Figure 2:
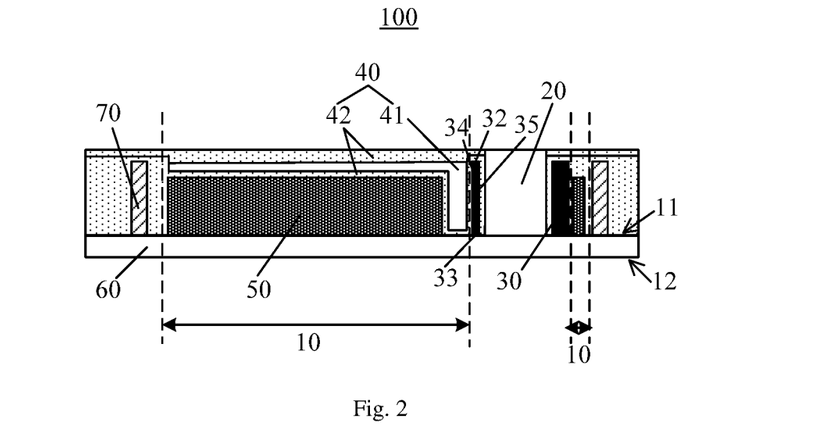
FIG. 2 shows a schematic cutaway view of the structure shown in FIG. 1 along AA.

FIGS. 1 and 2 schematically show a display panel 100 according to an embodiment of the present disclosure. The display panel 100 includes an active area 10 and an aperture area 20. The active area 10 is used to provide image display, for example, a structure such as a pixel unit may be provided therein. The aperture area 20 does not have circuit structures provided therein, for example, it is used to provide a working space for components such as cameras and sensors. In some embodiments, the aperture area 20 may include a closed opening, such as a round hole or a square hole. In other embodiments, the aperture area 20 may also include an open opening, such as a semicircular groove or a long groove. The aperture area 20 is at least partially surrounded by the active area 10. A barrier wall 30 is provided between the active area 10 and the aperture area 20. For example, in the case where the aperture area 20 includes a closed opening, the aperture area 20 may be completely surrounded by the barrier wall 30. Alternatively, the aperture area 20 may also be partially surrounded by the barrier wall 30. The function of the barrier wall 30 is to support and protect various film structures on the display panel 100, for example, to prevent a metal wire layer from being corroded by external water vapor and other pollutants, and also to block a flow range of the solution during evaporation or encapsulation process. In some embodiments, the aperture area 20 may be close to an edge of the display panel 100.

As shown in FIG. 2, the display panel 100 has a thin film encapsulation 40 on a first side 11, and the thin film encapsulation 40 covers the barrier wall 30 and the active area 10. The thin film encapsulation 40 is used to encapsulate various functional structures (such as light emitting components, thin film transistors, and circuit traces) on the display panel to prevent them from being damaged by external environment. In some embodiments, the barrier wall 30 has a convex-concave structure 31 on at least one surface in contact with the thin film encapsulation 40. As an example, the thin film encapsulation 40 may include an organic encapsulation layer 41 and one or more inorganic encapsulation layers 42. In FIG. 2, that two inorganic encapsulation layers 42 encapsulate the organic encapsulation layer 41 therein is shown, which can effectively protect the organic encapsulation layer 41. The embodiments of the present disclosure are not limited to this. In encapsulation process, the inorganic encapsulation layers 42 can be implemented by, for example, Plasma Enhanced Chemical Vapor Deposition (PECVD) or sputtering. The organic encapsulation layer 41 may have a solution leveling area during the encapsulation process (so-called leveling refers to a process in which the paint gradually shrinks to a minimum area due to effect of surface tension after being coated and before drying to form a film). In the leveling area, material forming the organic encapsulation layer 41 may increase first and then decrease in film thickness (i.e. a problem of local accumulation occurs during leveling). In a case where the display panel includes an internal aperture area (an aperture area at least partially surrounded by the active area), since the aperture area is limited in its structure, the local accumulation phenomenon occurs in the leveling near the aperture area 20 of the organic encapsulation layer 41 more obviously, especially when there is only a very narrow area between boundaries of the aperture area 20 and the active area 10 (as shown in FIG. 1). This situation is more common in practice. For example, the aperture area reserved for cameras and sensors is usually arranged closer to the boundary of the active area. Such local accumulation phenomenon may cause uneven layer thickness of the thin film encapsulation 40.

Therefore, the present disclosure provides a solution to suppress the local accumulation of the organic encapsulation layer. According to above analysis, for the display panel with the aperture area 20, the local accumulation of the organic encapsulation layer above mentioned mainly occurs near the aperture area 20. In a case where the barrier wall 30 is provided, the thin film encapsulation 40 will fully contact with a surface of the barrier wall 30 in the area near the aperture area 20. If contact area between the barrier wall 30 and the thin film encapsulation 40 can be increased, the organic encapsulation layer will flow more fully during the leveling process to alleviate the local accumulation phenomenon. In the embodiment of the present disclosure, the barrier wall 30 has a convex-concave structure 31 on at least one surface in contact with the thin film encapsulation 40. The convex-concave structure 31 may include, for example, uneven structures such as bumps and recesses, which may increase the contact area between the barrier wall 30 and the thin film encapsulation 40.

It should be noted that the barrier wall 30 does not need to be in contact with the organic encapsulation layer 41 in the thin film encapsulation 40 directly. For example, in some embodiments, one or more inorganic encapsulation layers 42 may cover the barrier wall 30 and encapsulate the organic encapsulation layer 41. In this embodiment, the barrier wall 30 is in contact with the inorganic encapsulation layer 42, and the inorganic encapsulation layer 42 is in contact with the organic encapsulation layer 41. However, corresponding part of the inorganic encapsulation layer 42 can be formed on the barrier wall 30 by deposition or sputtering, and its shape will also be affected by a shape of a contact surface between the barrier wall 30 and the inorganic encapsulation layer 42. For example, if there is a convex-concave structure on the contact surface between the barrier wall 30 and the inorganic encapsulation layer 42, there will be a corresponding convex-concave structure on a contact surface between the organic encapsulation layer 41 and the inorganic encapsulation layer 42. That is, the increase in the contact area between the barrier wall 30 and the inorganic encapsulation layer 42 can also indirectly lead to the increase in the contact area between the organic encapsulation layer 41 and the inorganic encapsulation layer 42, which can also alleviate the local accumulation phenomenon of the organic encapsulation layer 41 during the leveling process.

In some embodiments, the display panel 100 may also have a substrate 60. The substrate 60 may be located on a second side 12 (a lower side of the display panel 100 in the example of FIG. 2) of the display panel 100 opposite to the first side 11. The barrier wall 30 may have a first surface 32 (an upper surface of the barrier wall 30 in the example of FIG. 2) facing away from the substrate 60, a second surface 33 (a lower surface of the barrier wall 30 in the example of FIG. 2) facing the substrate, and an outer peripheral surface 34 and an inner peripheral surface 35. The outer peripheral surface 34 is located between the first surface 32 and the second surface 33 and is facing away from the aperture area 20 as a third surface. The inner peripheral surface 35 is located between the first surface 32 and the second surface 33 and faces the aperture area 20 as a fourth surface. The convex-concave structure 31 may include bumps or recesses disposed on at least one of the first surface 32, the second surface 33, the outer peripheral surface 34 and the inner peripheral surface 35 of the barrier wall 30.

Figure 3:
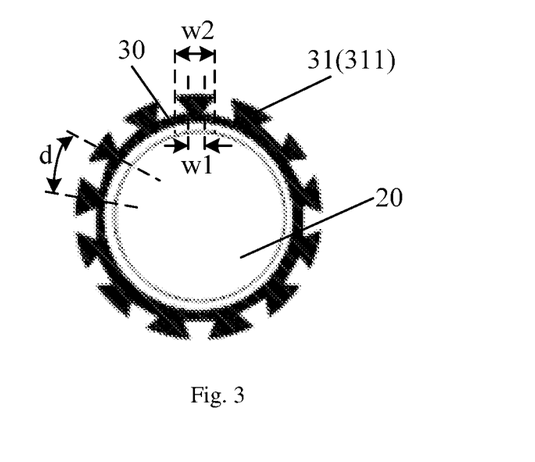
FIG. 3 schematically shows another barrier wall in the display panel according to an embodiment of the present disclosure.
Figure 5:
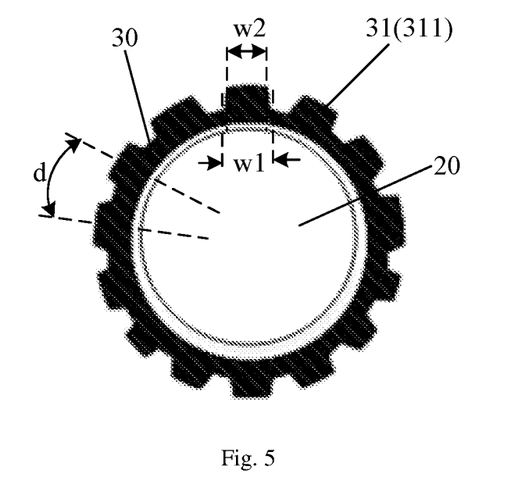
FIG. 5 schematically shows yet another barrier wall in the display panel according to an embodiment of the present disclosure.
Figure 6:
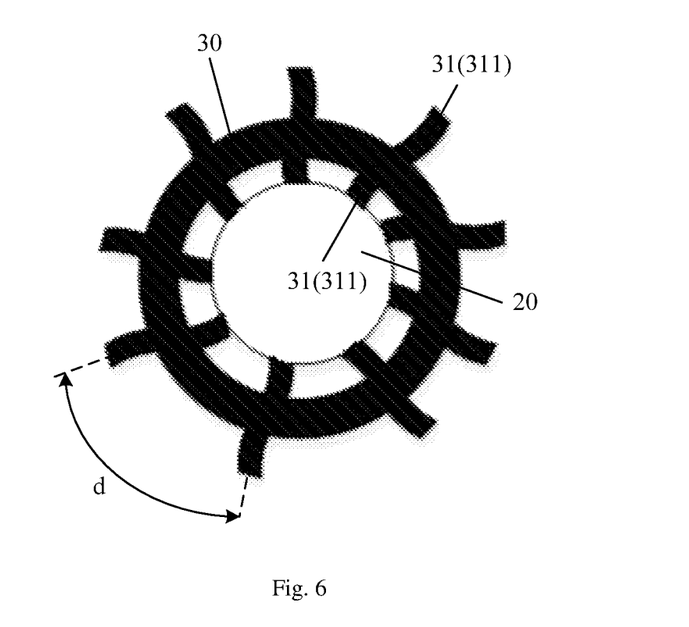
FIG. 6 schematically shows further another barrier wall in the display panel according to an embodiment of the present disclosure.
Figure 8:
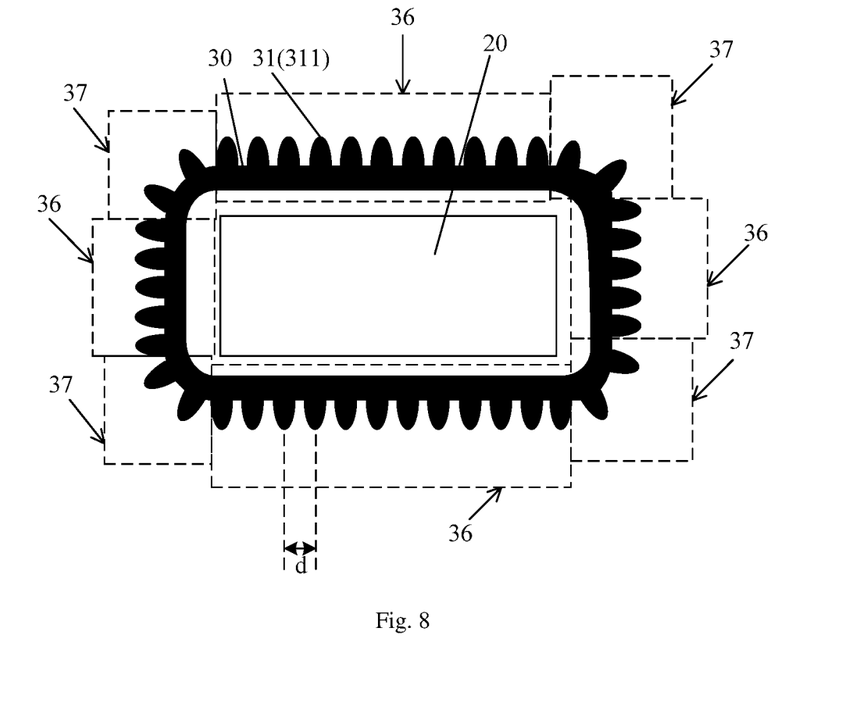
FIG. 8 schematically shows still another barrier wall in the display panel according to an embodiment of the present disclosure.

In the embodiment of FIG. 1, the convex-concave structure 31 includes bumps 311 located on the outer peripheral surface 34 of the barrier wall 30. In the embodiment shown in FIGS. 3 and 5, there is also a plurality of bumps 311 disposed on the outer peripheral surface 34 of the barrier wall 30, but specific shapes of the bumps 311 are different from the embodiment of FIG. 1. The embodiment of FIG. 6 shows a situation where bumps 311 are disposed on both the outer peripheral surface 34 and the inner peripheral surface 35 of the barrier wall 30. In another embodiment, the convex-concave structure 31 may be disposed only on the inner peripheral surface 34 of the barrier wall 30. The bumps 311 disposed on both the outer peripheral surface 34 and the inner peripheral surface 35 of the barrier wall 30, compared with the bumps 311 only disposed on the outer peripheral surface 34 or the inner peripheral surface 35, can obtain larger contact area between the barrier wall 30 and the thin film encapsulation 40, so as to alleviate the problem of local accumulation of the organic encapsulation layer 41 better. In above embodiments, a plurality of bumps 311 on the outer peripheral surface 34 and/or the inner peripheral surface 35 of the barrier wall 30 are disposed at intervals along a circumferential direction of the aperture area 20. An interval d between two adjacent bumps 311 in the plurality of bumps 311 may be the same or different. For example, the interval between two adjacent bumps 311 in the plurality of bumps 311 may be between about 3 μm and about 50 μm. Herein, "the interval between two adjacent bumps 311" mentioned can be obtained by measuring a distance between respective bottom center lines of two adjacent bumps 311 along a direction parallel to a surface where the bumps 311 are located, as shown in FIGS. 3, 5, 6 and 8. When the outer peripheral surface 34 and/or the inner peripheral surface 35 where the bumps 311 are located is flat (for example, as shown in FIG. 8), the "the interval between two adjacent bumps 311" can be measured along a straight line, and when the outer peripheral surface 34 and/or the inner peripheral surface 35 where the bumps 311 are located is curved (for example, as shown in FIGS. 3, 5, and 6), the "the interval between two adjacent bumps 311" can be measured along a curve line.

In some embodiments, a maximum width w1 of roots of the plurality of bumps 311 located on at least one of the outer peripheral surface 34 and the inner peripheral surface 35 of the barrier wall 30 is greater than a maximum width w2 of tops of the plurality of bumps 311, as shown in FIGS. 1 and 5. Such shape of the bumps 311 can prevent liquid flow of the organic encapsulation layer from accumulating near the root of the bumps 311, which is beneficial to make a layer thickness of the thin film encapsulation 40 more uniform. However, the embodiment of the present disclosure is not limited thereto. For example, the maximum width w1 of the roots of the bumps 311 may also be smaller than the maximum width w2 of the tops, as shown in FIG. 3, which helps to further increase the contact area between the barrier wall 30 and the thin film encapsulation 40.

It should be understood that the display panel 100 may also be provided with other film layer structures for display and other functions, such as a cathode layer, an anode layer, a light-emitting layer related to light emission of an organic light emitting diode, and a source and drain layer and a gate layer related to a thin film transistor. In FIG. 1 and FIGS. 7A to 7C, in order to simplify the structure shown, these film layer structures are represented by a film layer structure 50.

In the embodiments shown in FIGS. 1, 3, 5, and 6, the aperture area 20 is all in the form of a round hole. In this case, the interval between the bumps 311 can be set to be uniform to ensure that the organic encapsulation layer 41 can be evenly dispersed near the barrier wall 30. In some embodiments, as shown in FIG. 8, the barrier wall 30 has a straight segment 36 and a corner segment 37 in a cross section parallel to the substrate 60 (each straight segment 36 and corner segment 37 are shown by a dashed frame, respectively). The interval between two adjacent bumps 311 located on at least one of the outer peripheral surface 34 and the inner peripheral surface 35 of the barrier wall 30 in the straight segment 36 is smaller than that between two adjacent bumps 311 located on at least one of the outer peripheral surface 34 and the inner peripheral surface 35 of the barrier wall 30 in the corner segment 37, which can prevent the organic encapsulation layer from accumulating at the corner segment 37. In FIG. 8, only two adjacent bumps 311 are schematically shown in each corner segment 37, however, this is only illustrative, and the embodiment of the present disclosure is not limited thereto. For example, more bumps 311 may be disposed in a single corner segment 37.

Figure 7A:
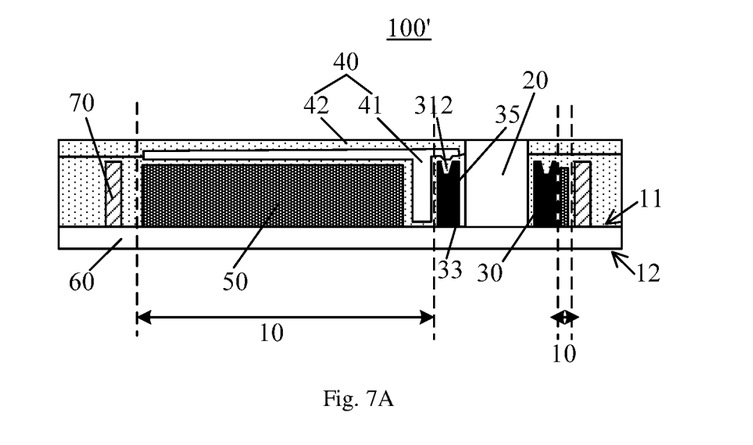
FIG. 7A shows a schematic cutaway view of the structure of another display panel according to an embodiment of the present disclosure.
Figure 7B:
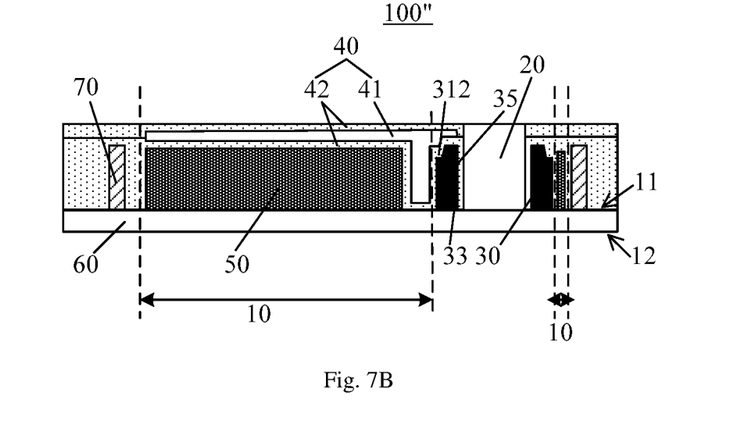
FIG. 7B shows a schematic cutaway view of the structure of still another display panel according to an embodiment of the present disclosure.
Figure 7C:
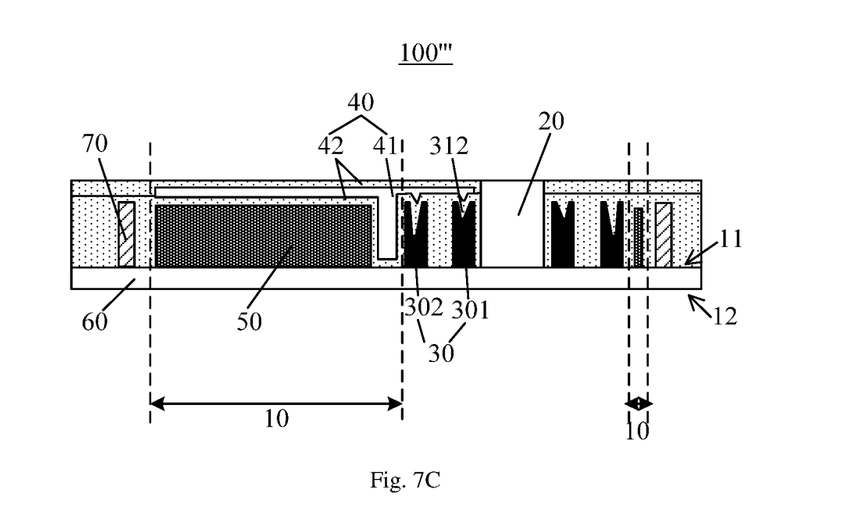
FIG. 7C shows a schematic cutaway view of the structure of yet another display panel according to an embodiment of the present disclosure.
Figure 7D:
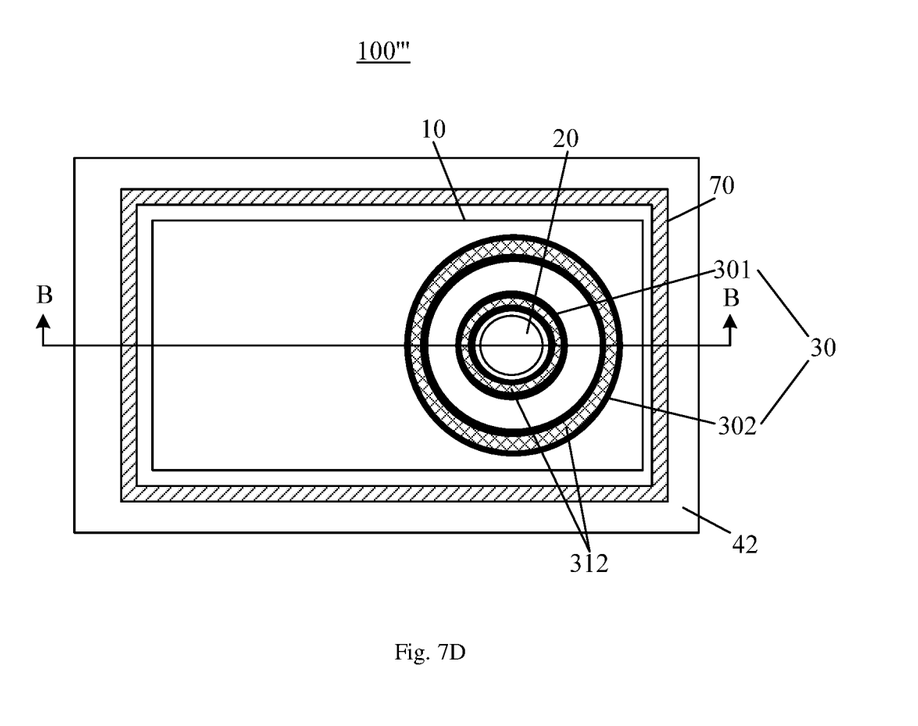
FIG. 7D shows a schematic top view of the structure shown in FIG. 7C.

In some embodiments, as shown in FIGS. 7A to 7D, in display panels 100', 100", 100''', the convex-concave structure 31 may include one or more recesses 312 on the first surface 32 of the barrier wall 30. The recesses 312 can also increase the contact area between the barrier wall 30 and the thin film encapsulation 40. In an embodiment of the present disclosure, one barrier wall 30 or a plurality of barrier walls 30 can be disposed near the aperture area on the display panel. For example, in the example shown in FIG. 7C, a first barrier wall 301 and a second barrier wall 302 disposed around the aperture area 20 are provided, and the second barrier wall 302 is located on a side of the first barrier wall 301 facing away from the aperture area 20 and arranged around the first barrier wall 301. In the embodiment of the present disclosure, more barrier walls may also be provided, which will not be repeated here. That a plurality of barrier walls are provided can further increase the contact area between the barrier wall and the thin film encapsulation 40, and can also make distribution of the liquid flow of the organic encapsulation layer 41 more uniform. Sizes of the bumps 311 or the recesses 312 on different barrier walls can be the same or different. For example, in the example shown in FIG. 7C, a depth of the recess on a first surface of the second barrier wall 302 is greater than the depth of the recess on a first surface of the first barrier wall 301. FIG. 7C shows a cutaway view taken along line BB in FIG. 7D. In FIG. 7D, for clarity, only the inorganic encapsulation layer 42 and barrier walls 301 and 302 are shown, but the organic encapsulation layer 41 and the film layer structure 50 are not shown.

Figure 4:
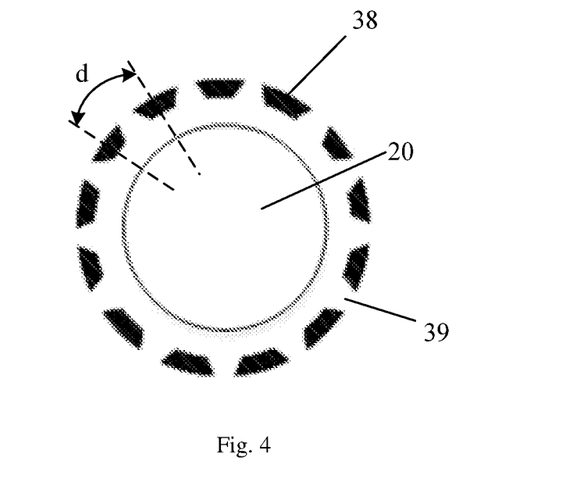
FIG. 4 schematically shows still another barrier wall in the display panel according to an embodiment of the present disclosure.

In the embodiment of the present disclosure, the barrier wall 30 may be continuous (as shown in the examples shown in FIGS. 1, 3, and 5) or discontinuous. For example, in the embodiment shown in FIG. 4, the barrier wall 30 includes a plurality of segments 38 arranged at intervals along a circumferential direction of the aperture area 20. A gap 39 between various segments 38 can also enable a more fully contact between the barrier wall 30 and the thin film encapsulation 40. As an example, an interval d between various segments 38 may be in the range of about 3 μm to about 50 μm. Herein, "about" refers to a value within the range of allowable process error and measurement error without strictly limiting the value.

Figure 9A:
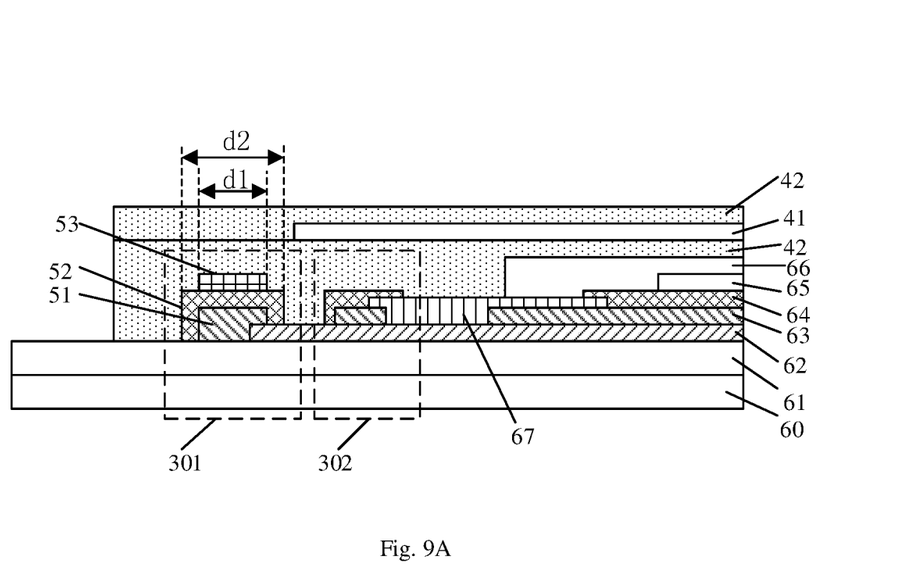
FIGS. 9A and 9B show schematic cutaway views of structures of other display panels according to embodiments of the present disclosure, in which more film layer structures are shown.
Figure 9B:
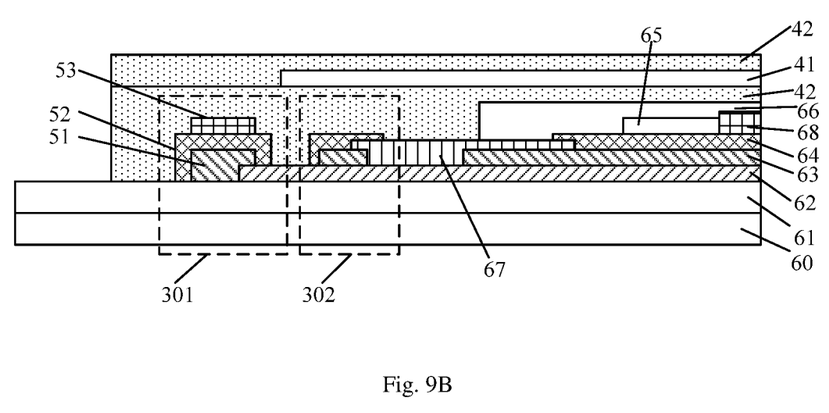

In the embodiment of the present disclosure, a height of the barrier wall 30 may be, for example, in the range of about 1 μm to about 5 μm. In the embodiment of the present disclosure, the barrier wall 30 may adopt a single-layer structure or a multilayer structure. FIGS. 9A and 9B show an embodiment in which the barrier wall 30 adopts a multilayer structure. FIGS. 9A and 9B show two types of barrier walls 30, that is, a first barrier wall 301 and a second barrier wall 302. The second barrier wall 302 is located on a side of the first barrier wall 301 facing away from the aperture area 20. The first barrier wall 301 includes a first insulating layer 51, a second insulating layer 52 and a third insulating layer 53. In the active area 10, an interlayer dielectric layer 61, a source and drain layer 62, a planarization layer 63, a pixel definition layer 64, a light-emitting function layer 65, a cathode layer 66, and an anode layer 67 may also be included. In this embodiment, the first insulating layer 51 may be arranged in the same layer as the planarization layer 63 in the active area (that is, formed in the same patterning process with the same material). The second insulating layer 52 may be arranged in the same layer as the pixel definition layer 64 in the active area (that is, formed in the same patterning process with the same material). The third insulating layer 53 may be arranged in the same layer as other insulating layers (for example, post spacers (PS) shown in FIG. 9B) in the active area (that is, formed in the same patterning process with the same material). The above-mentioned bumps or recesses may be disposed on a surface of at least one of the first insulating layer 51, the second insulating layer 52, and the third insulating layer 53 in contact with the thin film encapsulation, or may be formed by the second insulating layer 52 and the third insulating layer 53 jointly. For example, in FIG. 9A, a width d1 of a cross section of the third insulating layer is smaller than a width d2 of a cross section of the second insulating layer 52, and a convex-concave structure can be formed by means of difference between the two widths, which may save extra steps of forming the convex-concave structure and further simplify the process. In this embodiment, the second barrier wall 302 only includes the first insulating layer 51 arranged in the same layer as the planarization layer 63 and the second insulating layer 52 arranged in the same layer as the pixel definition layer 64. The first insulating layer 51, the second insulating layer 52, and the third insulating layer 53 constituting the first barrier wall 301 and the second barrier wall 302 are formed together with other film layers in the active area, which is beneficial to simplify the process and avoid adding extra cost to production of the barrier wall 30. The structure shown in FIG. 9B is different from FIG. 9A in that a post spacer (PS) layer 68 is shown.

As described above, in some embodiments, each barrier wall 30 includes one or more insulating layers on the substrate 60. One or more bumps or recesses are provided on a surface of each insulating layer in contact with the thin film encapsulation. It should be noted that, in the embodiment of the present disclosure, all insulating layers constituting the barrier wall 30 may be in contact with the thin film encapsulation, or only a part of the insulating layers may be in contact with the thin film encapsulation. In the embodiment of the present disclosure, the barrier wall 30 may be directly arranged on the substrate 60, or may be located in other film layers on the substrate 60. For example, in the embodiment shown in FIGS. 9A and 9B, the first barrier wall 301 and the second barrier wall 302 are located in the interlayer dielectric layer 61 on the substrate 60.

In some embodiments, the display panel may be an organic light emitting diode display panel. However, the embodiments of the present disclosure are not limited thereto.

It should be noted that, in some embodiments, in addition to the barrier wall 30 on the periphery of the aperture area 20 (that is, between the aperture area 20 and the active area 10), an additional barrier wall 70 may also be provided at other locations on the display panel. For example, as shown in FIGS. 1 and 2, on an outer periphery of the active area 10, an additional barrier wall 70 similar to the barrier wall 30 may also be provided. The additional barrier wall 70 may also be used to support and protect various film structures on the display panel 100. In some embodiments, the additional barrier wall 70 may have the convex-concave structure as described above on its surface in contact with the thin film encapsulation 40, or may not have such a convex-concave structure. The additional barrier wall 70 may be formed by the same process as the barrier wall 30 arranged on the periphery of the aperture area 20 (that is, between the aperture area 20 and the active area 10) to simplify the process.

Figure 10:
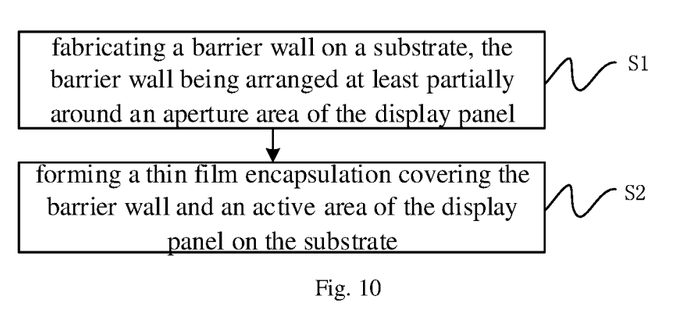
FIG. 10 shows a flowchart of a manufacturing method of a display panel according to an embodiment of the present disclosure.

The embodiment of the present disclosure also provides a manufacturing method of the display panel. As shown in FIG. 10, the method includes:

Step S1: fabricating a barrier wall on a substrate, the barrier wall being arranged at least partially around an aperture area of the display panel; and Step S2: forming a thin film encapsulation covering the barrier wall and an active area of the display panel on the substrate.

Herein, the barrier wall has a convex-concave structure on at least one surface in contact with the thin film encapsulation.

When the barrier wall 30 is formed by multiple insulating layers, step S1 may also include multiple sub-steps to form various insulating layers constituting the barrier wall 30 one by one. As mentioned above, the barrier wall 30 can be formed together with various functional layers in the active area 10 to simplify the process and save costs. The convex-concave structure on the barrier wall 30 can be obtained, for example, by designing a pattern of the barrier wall 30, and can be achieved by forming a pattern corresponding to the convex-concave structure on a mask in a patterning process such as photolithography.

The manufacturing method of the display panel mentioned above is only exemplary, and the embodiments of the present disclosure are not limited thereto.

Although the present disclosure has been described with reference to the accompanying drawings, the embodiments disclosed in the accompanying drawings are intended to exemplarily illustrate the embodiments of the present disclosure, and should not be understood as a limitation of the present disclosure. The dimensional ratios in the accompanying drawings are only schematic and should not be construed as limiting the present disclosure.

The embodiments mentioned above only exemplarily illustrate the principle and structure of the present disclosure, but are not used to limit the present disclosure. Those skilled in the art should understand that any changes and improvements made to the present disclosure without departing from the general idea of the present disclosure are within the scope of the present disclosure. The protection scope of the present disclosure shall be subject to the scope defined by the claims of the present disclosure.

What is claimed is:

1. A display panel, comprising:
an active area; and
an aperture area at least partially surrounded by the active area,
wherein at least one barrier wall is provided between the active area and the aperture area, a thin film encapsulation is provided on a first side of the display panel, and the thin film encapsulation covers the barrier wall and the active area,
wherein a convex-concave structure is provided on at least one surface of the barrier wall in contact with the thin film encapsulation,
wherein the display panel further comprises a substrate located on a second side of the display panel opposite to the first side, and the barrier wall has a first surface facing away from the substrate, a second surface facing the substrate, a third surface located between the first surface and the second surface and facing away from the aperture area, and a fourth surface located between the first surface and the second surface and facing the aperture area, and the convex-concave structure comprises a bump or a recess disposed on at least one of the first surface, the second surface, the third surface, or the fourth surface of the barrier wall,
wherein the barrier wall is cylindrical, and the convex-concave structure comprises a plurality of bumps, and the plurality of bumps are disposed on at least one of an outer peripheral surface or an inner peripheral surface of the barrier wall at intervals along a circumferential direction of the barrier wall, and
wherein roots of the plurality of bumps are spaced apart from each other along the circumferential direction of the barrier wall.

2. The display panel according to claim 1, wherein an interval between adjacent two bumps of the plurality of bumps is between about 3 μm and about 50 μm.

3. The display panel according to claim 1, wherein a maximum width of the roots of the plurality of bumps is greater than that of tops of the plurality of bumps.

4. The display panel according to claim 1, wherein the barrier wall has a straight segment and a corner segment in a cross section parallel to the substrate, and an interval between two adjacent bumps in the straight segment is smaller than that between two adjacent bumps in the corner segment.

5. The display panel according claim 1, wherein the convex-concave structure comprises one or more recesses disposed on the first surface of the barrier wall.

6. The display panel according to claim 1, wherein the at least one barrier wall comprises:
   a first barrier wall arranged around the aperture area; and
   a second barrier wall located on a side of the first barrier wall facing away from the aperture area and arranged around the first barrier wall.

7. The display panel according to claim 1, wherein each of the at least one barrier wall comprises at least one insulating layer on the substrate, and a bump or a recess is provided on a surface of the at least one insulating layer in contact with the thin film encapsulation.

8. The display panel according to claim 7, wherein the active area comprises an interlayer dielectric layer, a planarization layer, and a pixel definition layer, and the at least one insulating layer comprises:
   a first insulating layer, the first insulating layer and the planarization layer being disposed in the same layer and made of the same material; and
   a second insulating layer, the second insulating layer and the pixel definition layer being disposed in the same layer and made of the same material.

9. The display panel according to claim 8, wherein the active area further comprises a post spacer layer, and the at least one insulating layer further comprises:
   a third insulating layer, the third insulating layer and the post spacer layer being disposed in the same layer and made of the same material.

10. The display panel according to claim 1, wherein the thin film encapsulation comprises an organic encapsulation layer and one or more inorganic encapsulation layers, and the one or more inorganic encapsulation layers cover the barrier wall and encapsulate the organic encapsulation layer.

11. The display panel according to claim 1, wherein the display panel is an organic light emitting diode display panel.

12. The display panel according to claim 1, wherein the aperture area is completely surrounded by the barrier wall.

13. The display panel according to claim 6, wherein one or more recesses are disposed on a first surface of the first barrier wall facing away from the substrate, and one or more recesses are disposed on a first surface of the second barrier wall facing away from the substrate.

14. The display panel according to claim 13, wherein a depth of the one or more recesses on the first surface of the second barrier wall is greater than that of the one or more recesses on the first surface of the first barrier wall.

15. The display panel according to claim 9, wherein the third insulating layer is located on the second insulating layer, and a width of a cross section of the third insulating layer parallel to the substrate is smaller than that of a cross section of the second insulating layer parallel to the substrate, to form the convex-concave structure.

16. The display panel according to claim 1, wherein the display panel further comprises an additional barrier wall disposed on an outer periphery of the active area, and a convex-concave structure is provided on at least one surface of the additional barrier wall in contact with the thin film encapsulation.

17. A manufacturing method of a display panel, comprising:
   fabricating a barrier wall on a substrate, the barrier wall being arranged at least partially around an aperture area of the display panel; and
   forming a thin film encapsulation covering the barrier wall and an active area of the display panel on the substrate,
   wherein, a convex-concave structure is provided on at least one surface of the barrier wall in contact with the thin film encapsulation,
   wherein the display panel further comprises a substrate located on a second side of the display panel opposite to the first side, and the barrier wall has a first surface facing away from the substrate, a second surface facing the substrate, a third surface located between the first surface and the second surface and facing away from the aperture area, and a fourth surface located between the first surface and the second surface and facing the aperture area, and the convex-concave structure comprises a bump or a recess disposed on at least one of the first surface, the second surface, the third surface, or the fourth surface of the barrier wall,
   wherein the barrier wall is cylindrical, and the convex-concave structure comprises a plurality of bumps, and the plurality of bumps are disposed on at least one of an outer peripheral surface or an inner peripheral surface of the barrier wall at intervals along a circumferential direction of the barrier wall, and
   wherein roots of the plurality of bumps are spaced apart from each other along the circumferential direction of the barrier wall.

18. A display panel, comprising:
   an active area; and
   an aperture area at least partially surrounded by the active area,
   wherein at least one barrier wall is provided between the active area and the aperture area, a thin film encapsulation is provided on a first side of the display panel, and the thin film encapsulation covers the barrier wall and the active area,
   wherein a convex-concave structure is provided on at least one surface of the barrier wall in contact with the thin film encapsulation, and
   wherein the barrier wall is discontinuous and comprises a plurality of segments spaced apart from each other and arranged at intervals along a circumferential direction of the aperture area.

\* \* \* \* \*